United States Patent
Wang et al.

(10) Patent No.: US 8,105,954 B2
(45) Date of Patent: Jan. 31, 2012

(54) SYSTEM AND METHOD OF VAPOR DEPOSITION

(75) Inventors: Chien-Wei Wang, Wufong Township, Taichung County (TW); David Ding-Chung Lu, Hsinchu (TW); Ching-Yu Chang, Yilang County (TW)

(73) Assignee: Aiwan Semiconductor Manufacturing Company, Ltd., Hsin-Chu (TW)

( * ) Notice: Subject to any disclaimer, the term of this patent is extended or adjusted under 35 U.S.C. 154(b) by 584 days.

(21) Appl. No.: 12/254,658

(22) Filed: Oct. 20, 2008

(65) Prior Publication Data
US 2010/0099267 A1 Apr. 22, 2010

(51) Int. Cl.
*H01L 21/47* (2006.01)
(52) U.S. Cl. .......... 438/725; 438/680; 427/593
(58) Field of Classification Search .......... 427/581, 427/582, 587, 593
See application file for complete search history.

(56) References Cited

U.S. PATENT DOCUMENTS
2009/0023284 A1* 1/2009 Lin et al. .......... 438/618

OTHER PUBLICATIONS

William Mahoney et al., "Mist Deposition of Thin Photoresist Films", Advances in Resist Technology and Processing XXI, edited by John L. Sturtevant, Proceedings of SPIE vol. 5376 (SPIE, Bellingham WA, 2004), 0277-786X/04, pp. 861-866.

* cited by examiner

*Primary Examiner* — Zandra Smith
*Assistant Examiner* — Pamela E Perkins
(74) *Attorney, Agent, or Firm* — Haynes and Boone, LLP

(57) ABSTRACT

Provided is a method and system for vapor deposition of a coating material onto a semiconductor substrate. In an embodiment, photoresist is deposited. An in-situ baking process may be performed with the vapor deposition. In an embodiment, a ratio of chemical components of a material to be deposited onto the substrate is changed during the deposition. Therefore, a layer having a gradient chemical component distribution may be provided. In an embodiment, a BARC layer may be provided which includes a gradient chemical component distribution providing an n,k distribution through the layer. Other materials that may be vapor deposited include pattern freezing material.

19 Claims, 8 Drawing Sheets

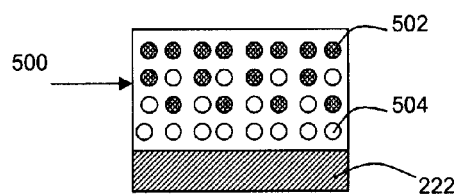 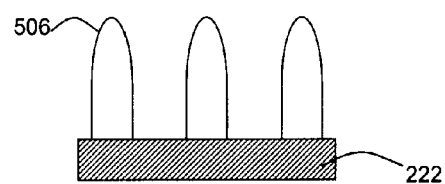
Figure 5A Figure 5B
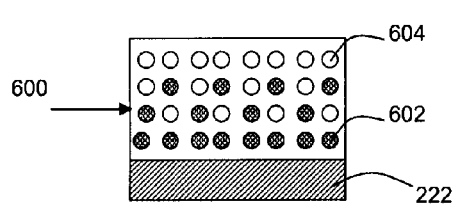 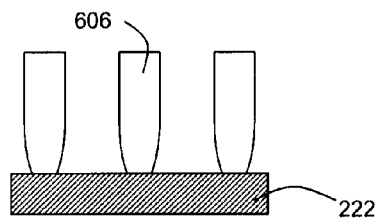
Figure 6A Figure 6B
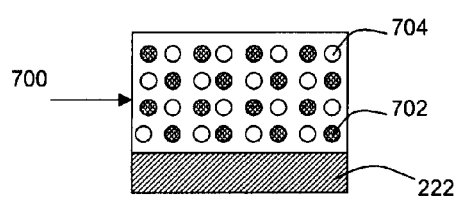 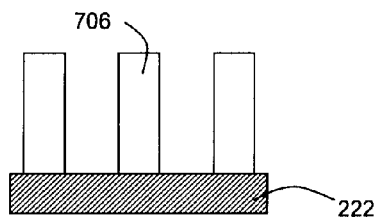
Figure 7A Figure 7B

SYSTEM AND METHOD OF VAPOR DEPOSITION

BACKGROUND

The present disclosure relates generally to semiconductor fabrication and, more particularly, to a method of depositing materials onto a semiconductor substrate (e.g., wafer).

In integrated circuit (IC) manufacturing technology, a photoresist (resist) layer is typically applied to a semiconductor wafer surface, followed by a soft bake, and an exposure of the resist through a photomask. A post-exposure baking process and a developing process are then performed to form a patterned resist layer with openings. After verification that the resist is within fabrication specifications, the wafer is processed using the patterned resist as a masking element. Following processing (e.g., etch, implant, etc) of the wafer, the resist layer may be stripped.

In conventional photoresist deposition—spin-on coating—the photoresist layer suffers from non-uniform chemical distribution and intermixing with other layers. This non-uniform chemical distribution can negatively affect line edge roughness and cause pin holes to form in the sidewalls of the resist pattern after development. This effect is especially problematic for thin photoresists of less than 75 nm, which is needed for high lithography resolution. Similar issues are provided with other deposition materials (e.g., coatings) that may be deposited on the substrate.

It would therefore be desirable to have an improved method and system of depositing materials onto a semiconductor wafer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A, 6A, and 7A are cross-sectional views illustrating embodiments of substrates having a layer of photoresist with varying chemical component distributions.

FIGS. 5B, 6B, and 7B are cross sectional views illustrating embodiments of substrates including photoresist features having profiles determined by the chemical component distributions of FIGS. 5A, 6A, and 7A respectively.

DETAILED DESCRIPTION

The present disclosure relates generally to semiconductor fabrication and, more particularly, to a method of depositing materials such as, photoresists and other coating materials, using a vapor deposition process. It is understood, however, that specific embodiments are provided as examples to teach the broader inventive concept, and one of ordinary skill in the art can easily apply the teaching of the present disclosure to other methods or devices. In addition, it is understood that the methods and apparatus discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. The formation of a feature on a substrate may include embodiments where features are formed above the surface of the substrate, directly on the surface of the substrate, or extending below the surface of the substrate, such as trenches. A substrate may include a semiconductor wafer and one or more features formed on the wafer such as conductive layers, insulating layers, isolation regions, doped regions, or other features known in the art.

In a conventional spin coating process, the material deposited (e.g., resist solution) is provided to the wafer by spinning centrifugal forces. During the process of deposition, the resist components are included in a solvent rich matrix. The components easily aggregate, phase separate, and/or intermix with each other or adjacent layers. The aggregation, separation, and/or intermixing introduces a disproportionate chemical distribution as to what may be intended in the fabrication. For photoresist, this may induce a non-uniform chemical amplified reaction (CAR) and undesirable acid distribution which may lead to poor line edge roughness (LER) and defects (e.g., pinholes in sidewall of features). A baking process is performed after the spin coating process to evaporate a solvent(s) included in the resist solution.

Figure 1:
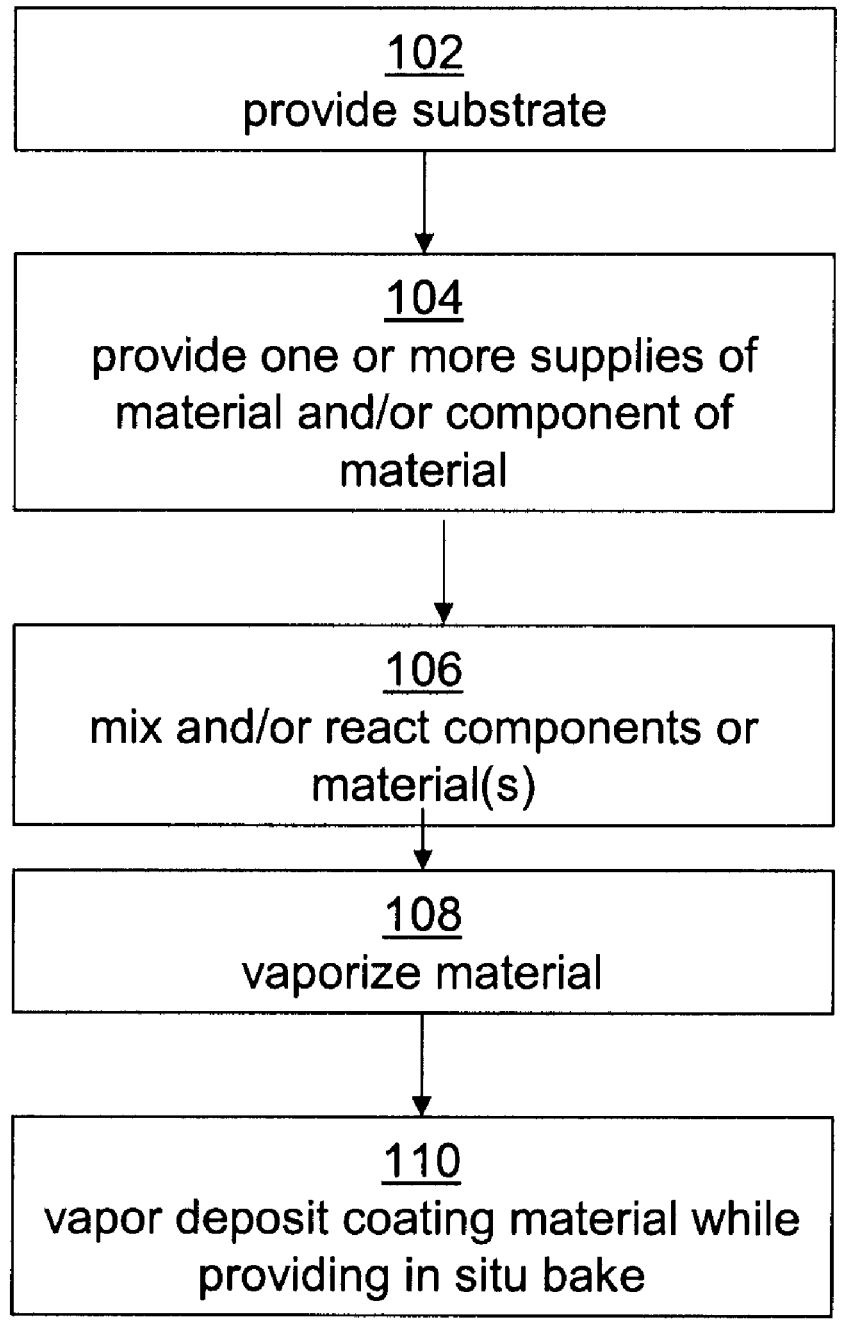
FIG. 1 is a flow chart illustrating an embodiment of a method to vapor deposit a material onto a semiconductor substrate.

Referring to FIG. 1, illustrated is a method 100 for vapor depositing a material on a semiconductor substrate. The method begins at step 102 by providing a substrate. The substrate may include silicon. The substrate may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate may include a non-semiconductor material such as a glass substrate for thin-film-transistor liquid crystal display (TFT-LCD) devices, or fused quartz or calcium fluoride for a photomask (mask). In an embodiment, the substrate includes one or more material layers (e.g., insulating, conductive, semiconductive, etc) formed thereon. The substrate may include various doped regions, dielectric features, and multilevel interconnects. In one embodiment, the substrate includes various doped features for various microelectronic components, such as a complementary metal-oxide-semiconductor field-effect transistor (CMOSFET), imaging sensor, memory cell, and/or capacitive element.

The method 100 then proceeds to step 104 where one or more materials and/or chemical components of a material are provided. A material may include one or more chemical components. By way of example, materials provided may include one or more photoresist compositions and/or chemical components of a photoresist. Chemical components of a photoresist may include photo acid generator (PAG), quencher, surfactant, polymer resin, surface segregated additive, crosslinker, chromophore, solvent, and/or other suitable components. In other embodiments, the materials provided may include an antireflective coating such as, BARC, a crosslinking material, an organic etch stop layer, an inorganic etch stop layer, hard mask (e.g., silicon-containing hard mask), silicon, $Si_3N_4$, SiON, Ti, TiN, Ta, TaN, SiOx, and/or other materials suitable for forming one or more features of a semiconductor device.

The method 100 then proceeds to step 106 where the materials and/or chemical components may be mixed. In an embodiment, the materials and/or chemical components may react to form one or more compositions in addition to or in lieu of the supplied materials. The reaction may provide a composition of a different molecular weight than the supplied material or components. In an embodiment of the method 100, the step 106 is omitted. The mixing and reaction may occur in separate process steps, e.g., separate chambers. In an embodiment, the reaction of the materials and/or chemical components requires the introduction of heat, a chemical catalyst, and/or other reaction mechanism. The method 100 then proceeds to step 108 where the materials may be vaporized. In an embodiment, one or more of the materials supplied in step 104 or provided in the reaction of step 106 is in vapor form. In such an embodiment, the step 108 may be omitted.

The method 100 then proceeds to step 110 where the material(s) is vapor deposited onto the surface of the substrate. The vapor depositing may be performed using a vapor deposition system such as, a system 200 described with reference to FIG. 2. In an embodiment, the material may be deposited using one or more nozzles to deposit a spray including materials across the wafer. During the vapor deposition, a bake process may be provided in-situ (e.g., immediately following and/or concurrently with the vapor deposition without moving the substrate to a separate tool/chamber). The bake process may drive off (e.g., evaporate) a solvent present in the material(s). During the deposition and/or baking process, solvent may be withdrawn from the environment of the substrate by a vacuum system. The bake process may be provided by a heating element providing an elevated temperature to the substrate such as, the heating element 224, also described with reference to FIG. 2. In an embodiment, the deposition temperature is less than 150 C. (exemplary and not limiting). In an embodiment, the deposition pressure is less than 1.2 atm (exemplary and not limiting). In an embodiment, the thickness of one or more layers deposited is less than 200 nm (exemplary and not limiting).

As an example, in an embodiment, a photoresist may be vapor deposited onto a substrate. The substrate may be heated, in-situ, to drive off the solvent (or portion thereof). The reduction of the solvent in the formed photoresist layer may reduce the free volume which provides reduced motion of components of the photoresist. This may prevent separating, intermixing, and/or aggregation such as described above with reference to a spin-on photoresist process. The vapor deposition of the photoresist may provide a more uniform chemical distribution, which may provide a more uniform CAR reaction and a more-well defined acid diffusion boundary. The improved diffusion boundary leads to improved exposure of an image, better LER, and/or fewer defects. Step 110 may include depositing a plurality of layers on the substrate. In an embodiment, step 110 may include providing a single layer having a gradient chemical component distribution, for example, formed by varying the supply of one or more chemical components during the vapor deposition.

In an embodiment, a photoresist layer is deposited on a substrate using the method 100 or portion thereof, including deposition of the photoresist layer by vapor deposition with in-situ baking process. The method 100 may continue to provide exposure of the photoresist layer to a pattern. The exposure may include irradiation using an ArF, EUV, E-Beam, and/or other suitable radiation. The photoresist may include a PAG, quencher, surfactant, and acid cleavable molecule. The PAG may release acid after irradiation. The method 100 may further continue to provide for development, post-exposure bake, rinse, dry, and/or other suitable photolithography processes. The acid labile polymer may release its leaving group after reacting with acid at post exposure bake step. After releasing the acid leaving group, the polymer may become more soluble to water than the as deposited resist. In an embodiment, the vapor deposition with in-situ baking process eliminates a soft bake process found in conventional lithography processes (e.g., bake after deposition before exposure).

Figure 2:
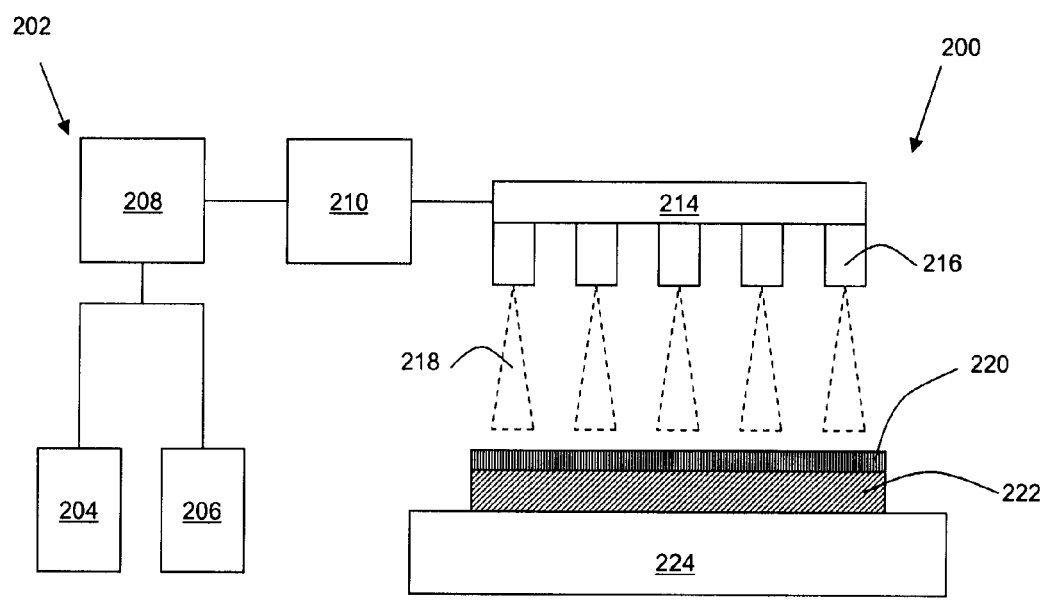
FIG. 2 is perspective view illustrating a system for vapor depositing material onto a semiconductor substrate.

Referring now to FIG. 2, illustrated is a system 200 for vapor deposition including in-situ baking process. The system 200 includes a vapor deposition system 202 including material supply chambers 204 and 206, a mixing chamber 208, a reaction chamber 210, a vapor deposition support device 214, and nozzles 216. Though illustrated as two supply chambers 204, 206, any number of supplies may be provided. In an embodiment, a single material supply chamber is provided such as, chamber 204. In an embodiment, the mixing chamber 208 and/or the reaction chamber 210 are omitted from the system 200. The nozzles 216 may include any number of nozzles. The system 200 may allow for liquid components to be supplied in chamber 204 and/or 206 and vaporization occurs at any point in the system 200, such as at supply 204 or 206, mixing chamber 208, reaction chamber 208, vapor deposition support device 214, and/or nozzles 216.

A vapor 218 is provided by the vapor deposition system 202 and released from the nozzles 216. The vapor 218 may include one or more materials and/or chemical components supplied from the supply chamber 204 or 206, and/or that are the reaction product provided in the reaction chamber 210 and/or mixing chamber 208. The vapor 218 forms a layer 220 on a wafer 222. The layer 220 may be substantially uniformly across the surface of the entire surface wafer 222. The wafer 222 is positioned on a heating element 224. The heating element 224 is operable to provide an elevated temperature to the substrate 222, and in particular to the layer 220 (e.g., a bake process for the substrate 222). The bake process may be provided in-situ with the vapor deposition. In an embodiment, the heating element 224 is operable to provide a bake process to the substrate 222 substantially simultaneous with the deposition of the vapor 218 on the substrate 222 (e.g., during the formation of the layer 220). In an embodiment, the heating element 224 is operable to provide a bake process following the deposition of the layer 220 without transport of the substrate 222 from a vapor deposition chamber (e.g., the environment of providing the vapor 218).

The supply chambers 204 and 206 may provide for control over a relative ratio (e.g., flowrate) of materials and/or chemical components that are supplied from each of the chambers. In an embodiment, the ratio of the component of supply chamber 204 may vary with respect to the component of the supply chamber 206, for example, as the vapor 218 is provided to the substrate 222. Example embodiments of such are described below with reference to FIGS. 5A, 6A, 7A, and/or 11. The deposition system 200 may include one or more valves that control the flow of components from the supply chambers 204, 206. For example, the composition of a deposited layer 220 may be controlled by tuning the supply of components from chambers 204, 206. In an embodiment, materials from one supply may be deposited, and subsequently material from another supply may be provided (see, e.g., FIG. 4).

In an embodiment, the system 200 includes a vacuum device. The vacuum device may be operable to remove any material removed (e.g., evaporated) from the layer 220 resulting from the bake process provided by the heating element 224. In an embodiment, the material removed includes a solvent. The solvent may be a solvent included in a photoresist.

The substrate 222 may include silicon. The substrate 222 may also include other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Alternatively, the substrate 222 may include a non-semiconductor material such as a glass substrate for thin-film-transistor liquid crystal display (TFT-LCD) devices, or fused quartz or calcium fluoride for a photomask (mask). In an embodiment, the substrate 222 includes one or more material layers (e.g., insulating, conductive, semiconductive, etc) formed thereon. The substrate 222 may include various doped regions, dielectric features, and multi-level interconnects. In one embodiment, the substrate 222 includes various doped features for various microelectronic components, such as a complementary metal-oxide-semiconductor field-effect transistor (CMOSFET), imaging sensor, memory cell, and/or capacitive element.

In an embodiment, the vapor 218 deposits a layer 220 including photoresist on the substrate 222. One or more components such as, PAG, quencher, surfactant, polymer resin, surface segregated additive, crosslinker, chromophore, acid cleavable molecule, and solvent may be included in the supply 204 and/or 206. In alternative embodiments, the supplies 204, 206 and/or the vapor 218 may include components such that a layer 220 includes ARC (e.g., BARC), top coat, adhesion layer, crosslinking material, organic etch stop layer (ESL), inorganic ESL, Si, $Si_3N_4$, SiON, Ti, TiN, Ta, TaN, SiOx, and/or other suitable materials. The layer 220 may include a plurality of layers.

Figure 3:
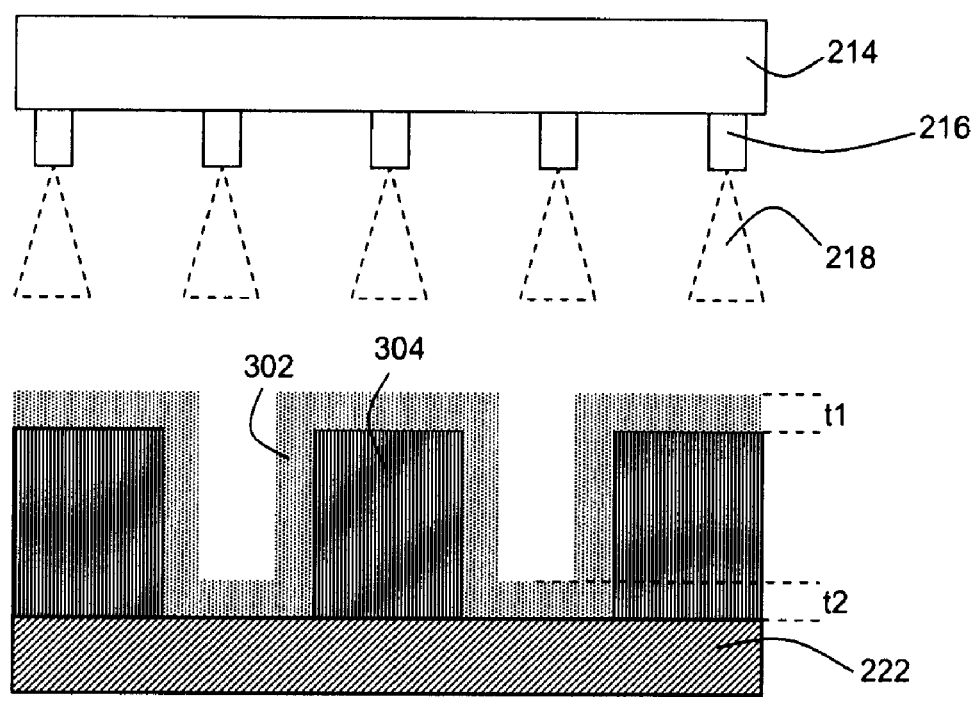
FIG. 3 is a cross-sectional view illustrating a system of vapor depositing a conformal coating on a semiconductor substrate.

Referring now to FIG. 3, illustrated is an embodiment of deposition of a vaporized material 218 to form a conformal layer 302 on the substrate 222. FIG. 3 may be representative of the deposition of a layer using the method 100. FIG. 3 may be representative of use of the system 200. The conformal layer 302 includes a thickness t1 at the top of a feature 304 and a thickness t2 at the bottom of a feature 304 adjacent the substrate 222, t1 and t2 are approximately equal. This is in contrast to deposition of a material using a conventional spin-coating process. The spin-coating process may provide a thinner layer of material at the top of a feature (such as, feature 304) than on the underlying substrate (such as substrate 222). The conventional process may provide, for example, a thickness corresponding to t2 may be four times greater than a thickness corresponding to t1. This may provide for a narrow etch process window when, for example, forming a trench for a shallow trench isolation feature (STI). The features 304 may include photoresist, BARC, top coat, Si containing organic hard mask, Si, $Si_3N_4$, SiON, Ti, TiN, Ta, TaNx, SiOx, and/or other suitable materials. The layer 302 may include photoresist, BARC, top coat, Si containing organic hard mask, Si, Si3N4, SiON, Ti, TiN, Ta, TaNx, SiOx, and/or other suitable materials.

Figure 4:
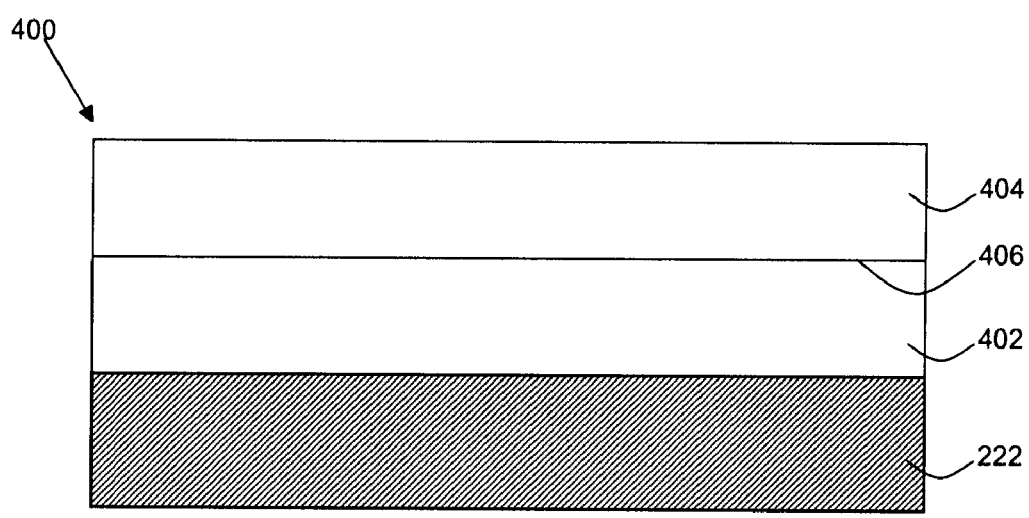
FIG. 4 is a cross-sectional view illustrating a semiconductor substrate including a plurality of layers formed by vapor deposition according to the method of FIG. 1.

Referring now to FIG. 4, illustrated is a multi-layer semiconductor device 400 including a plurality of layers deposited on the substrate 222. The semiconductor device 400 may be formed using the method 100, the system 200, and/or a portions thereof. The semiconductor device 400 includes a layer 402 and a layer 404. The layers 402 and 404 may include photoresist, antireflective coating (e.g., BARC), top coat, adhesion layers, crosslinking materials, organic and inorganic etch stop layer, Si, $Si_3N_4$, SiON, Ti, TiN, Ta, TaN, SiOx, and/or other suitable materials. The layer 402 and the layer 404 have an interface 406. The interface 406 illustrates a substantially discrete interface between layers 404 and 402 (in contrast to a mixing of the layers). The layer 402 and layer 404 may be vapor deposited in-situ using the method 100 and/or the system 200. A bake process may be performed in-situ with the depositions. In an embodiment, the layer 402 and the layer 404 include separate and distinct compositions. In an embodiment, the layer 402 and the layer 404 include related compositions, for example, similar compositions having ratios of one or more components adjusted.

In an embodiment, a first deposited layer, layer 402, and the second deposited layer, layer 404, each provide for different etch resistances (e.g., etch rates). Layer 402 and/or the layer 404 may include an etching resistance molecule. The molecule may include a low onishi number structure, double bond structure, triple bond structure, silicon, silicon nitride, Ti, TiN, Al, aluminum oxide, SiON, and/or other suitable component.

In an embodiment, the layer 402 includes photoresist and layer 404 includes a composition more hydrophobic than layer 402. In an embodiment, the layer 404 includes fluorine. The layer 404 may include an isolation layer between an immersion fluid of an immersion lithography system and the layer 402 (e.g., resist). In an embodiment, the immersion fluid includes water.

Using conventional spin-coating process, multi-layer applications such as illustrated by the semiconductor device 400 may raise issues. For example, components may intermix with other layers reducing the opportunity to create an interface between layers such as, the interface 406. By providing vapor deposition according the method 100 and/or the system 200, a plurality of layers may be provided in-situ (e.g., at the same time using the same system). The solvent-reduced composition provided by the in-situ bake (and/or vacuum) reduces the movement of components. This may provide for reduced intermixing of components between different layers of a multi-layer structure, in contrast with the interface 406. In an embodiment, the layers 402 and/or layer 404 include a surface switchable photoresist.

Referring now to FIGS. 5A, 5B, 6A, 6B, 7A, and 7B, illustrated are cross-sections providing a layer of resist as deposited, and the corresponding patterned resist feature provided from the layer of resist. The layers of resist may be formed using the method 100 and/or the system 200, described above with reference to FIGS. 1 and 2 respectively. In FIG. 5A, the resist layer 500 is formed on the substrate 222. The resist layer 500 includes a greater distribution of component 502 at the surface and a greater distribution of component 504 at the bottom of the photoresist layer 500. The resist layer 500 may be provided by tuning the ratio of component 502 and 504 while vapor depositing the resist layer 500. In an embodiment, the component 502 includes an acid producing component, and the profile 506 (e.g., tapered top) is provided.

In FIG. 6A, the resist layer 600 includes a greater distribution of component 604 at the surface and a greater distribution of component 602 at the bottom of the photoresist layer 600. The resist layer 600 may be provided by tuning the ratio of component 602 and 604 while vapor depositing the resist layer 600. In an embodiment, the component 602 includes an acid producing component (CAR) and the profile 606 (e.g., tapered bottom) is provided. In FIG. 7A, the resist layer 700 illustrates a photoresist layer having a substantially distributed composition of component 702 and 704. The profile 706 is provided illustrating a substantially uniform thickness profile 706. The profiles 506, 606, and/or 706 provide photoresist features that may be used to provide masking elements for subsequent processing of the substrate 222. The photoresist features including profiles 506, 606, and/or 706 are provided by exposing the photoresist layers 500, 600, and 700 respectively to a pattern, performing a post-exposure bake, and developing the resist and/or other suitable photolithography processes known in the art.

Therefore, the method 100 and/or the system 200 provide a method and system respectively to control the composition (e.g., ratio of components) of a deposited layer. For example, the composition of a photoresist layer may be controlled such that a desired profile of a resultant photoresist feature is formed (e.g., an undercut feature). See FIGS. 5A, 6A, 7A. In contrast, a conventional spin coating process provides a fixed formulation of photoresist that does not allow for modification of the distribution as deposited. This provides difficulties in controlling a photoresist profile. Using the method 100 and/or the system 200, the composition of a layer as deposited, e.g., the composition of a photoresist layer, may be varied by controlling the ratio of two or more components of the material (e.g., controlling PAG component or distribution of acid produced by an exposed resist layer).

Figure 8:
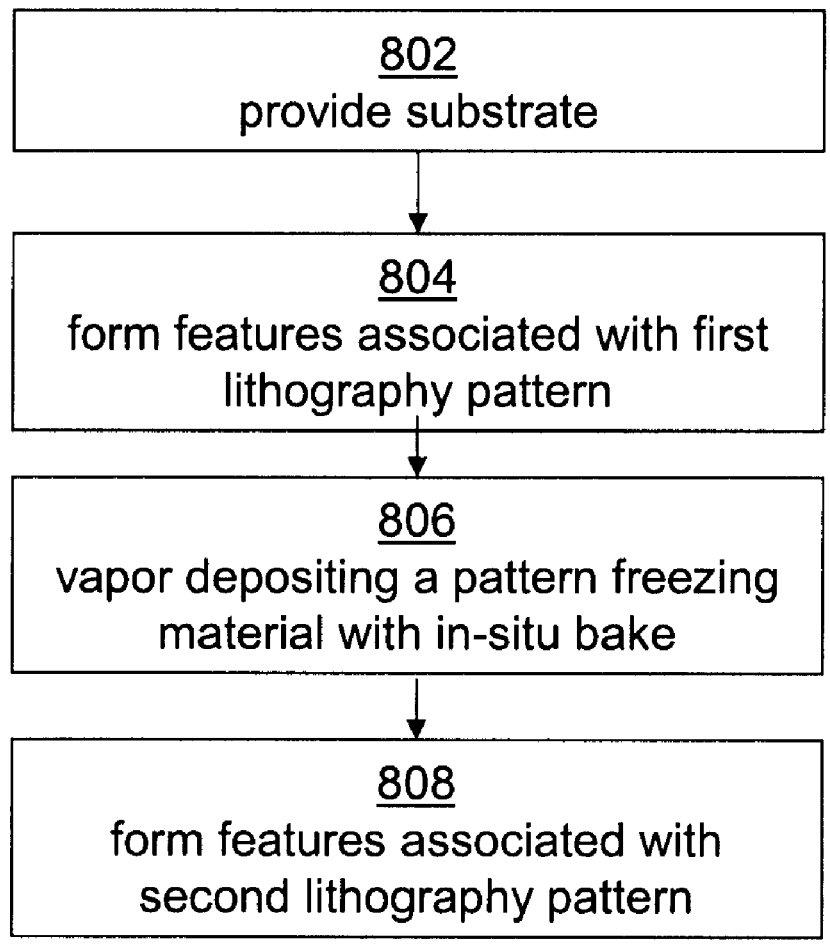
FIG. 8 is a flow chart illustrating an embodiment of a method of performing dual pattern lithography.
Figure 9:
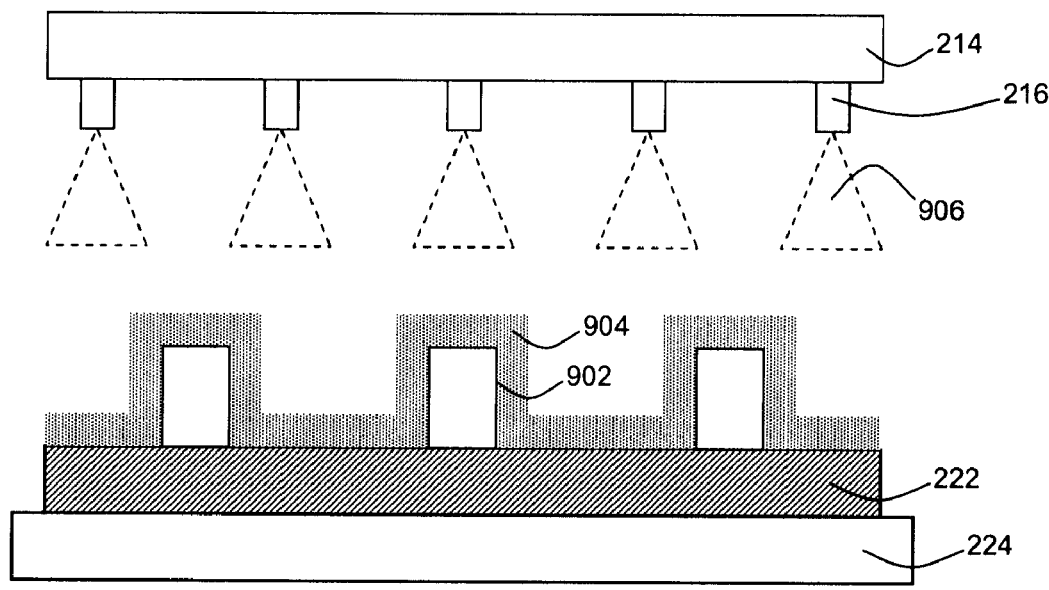
FIGS. 9 and 10 are cross-sectional views illustrating an embodiment of a substrate according to the steps of the method of FIG. 8.

Referring now to FIG. 8, illustrated is a method 800 for performing a dual pattern photolithography process. The method 800 begins at step 802 where a substrate is provided. Referring to the example of FIG. 9, the substrate 222 is provided. The substrate 222 may be substantially similar to as described above with reference to FIG. 2. The method 800 then proceeds to step 804 where features associated with a first lithography process are formed. Referring again to FIG. 9, the substrate 222 includes features 902. The features 902 may provide photoresist features associated with a first lithography step (e.g., formation of a first pattern on the substrate 222).

The method 800 then proceeds to step 806 where a pattern freezing material may be vapor deposited on the features associated with the first lithography process. A pattern freezing material may include a cross linkable component. The pattern freezing material may be deposited by vapor deposition including in-situ baking process. The pattern freezing material may be deposited using the method 100, the system 200, and/or portions thereof. Referring to the example of FIG. 9, a vaporized pattern freezing material 906 is deposited on the substrate 222, and in particular on the first features 902. The vaporized pattern freezing material 906 forms the pattern freezing layer 904. The pattern freezing layer 904 may be a discrete layer, or be intermixed with the features 902. The pattern freezing material 906 may be deposited by a vapor deposition system including the vapor deposition support device 214 and the nozzles 216. The substrate 222 is positioned on the heating element 224. The heating element 224 may provide a baking process to the environment of the substrate 222. The baking process may be performed in-situ with the deposition of the pattern freezing material 906 (e.g., at substantially the same time and/or following the deposition of the pattern freezing layer 904 without moving the substrate 222 from the processing tool).

The patterning freezing material may induce cross linking reactions to the features on which it is deposited and/or within the layer of pattern freezing material provided. In an embodiment, after the step 806, the pattern freezing material may be rinsed from the substrate using a developer solution and/or de-ionized water.

In a conventional deposition process of pattern freezing material, the features associated with the first lithography process may be easily damaged by the solvent used in the pattern freezing material. The damage may include CD bias and/or profile issues. The vapor deposition process including in-situ baking provides a reduced (or eliminated) solvent environment for the features.

Figure 10:
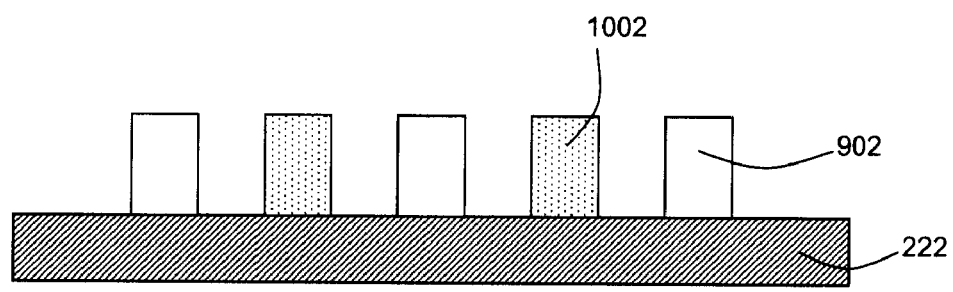

The method 800 then proceeds to step 808 where a second set of features associated with a second lithography pattern are formed on the substrate. Due to the pattern freezing material (e.g., cross-linking reactions), the second set of features may be formed without intermixing with the first formed features. For example, to form the second set of features a photoresist layer may be deposited, exposed, and developed. Such processes may not affect the first set of features as they include cross linked photoresist. Referring to the example of FIG. 10, second features 1002 are formed on the substrate 222. Thus a pattern including the first features 902 and the second features 1002 is provided, which may provide for a reduced pitch. In an embodiment, the second features 1002 may be formed using vapor deposition with in-situ baking such as provided by the method of FIG. 1 and/or the system of FIG. 2.

Figure 11:
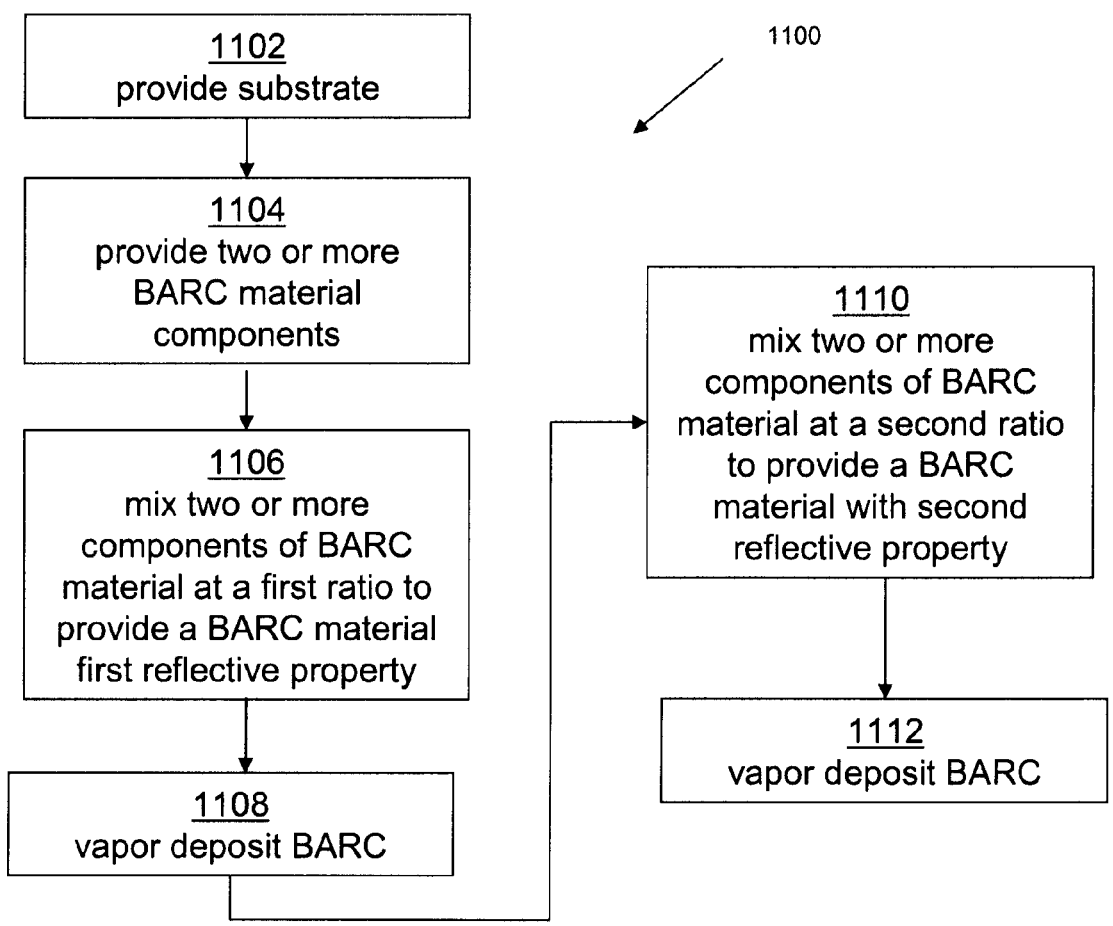
FIG. 11 is a flow chart illustrating an embodiment of a method of vapor depositing an antireflective coating (ARC) material having varying reflective properties on a semiconductor wafer.

Referring now to FIG. 11, illustrated is a method 1100 proving an embodiment of vapor depositing an antireflective coating (ARC), e.g., a BARC. The method 1100 begins at step 1102 where a substrate is provided. The substrate may be substantially similar to the substrate provided above in step 102 of the method 100. The method 1100 then proceeds to step 1104 where two or more BARC material components are provided. The BARC components may be supplied in material supply systems such as, the supply systems 204 and/or 206 of the deposition system 200. The components provided and/or the ratio of the provided components may determine a n and/or k value (reflectivity and/or absorptance) of the deposited BARC layer.

The method 1100 then proceeds to step 1106 where the BARC components, in a determined first ratio, are then mixed. In an embodiment, the components are mixed in a mixing chamber such as, the mixing chamber 208, described above with reference to FIG. 2. In an embodiment of the method 1100, the components may be reacted, for example, in a reaction chamber such as the reaction chamber 210, also described above with reference to FIG. 2. The mixed (and/or reacted) components provide a BARC composition that includes a reflectivity property, for example, as determined by the ration of components and/or the composition of components provided.

The method 1100 then proceeds to step 1108 where the BARC is vapor deposited onto the substrate. The BARC may be deposited using the vapor deposition system 202, or portion thereof. In an embodiment, the BARC is vaporized in the system 202 and provided to the substrate through nozzles such as, the nozzles 216. In an embodiment, heating element is used to provide a baking process in-situ with the vapor deposition of the BARC material. In a further embodiment, a vacuum device is used to remove evaporants from a formed BARC layer (e.g., released by the baking process). In an embodiment, the heating element and bake process are omitted. The deposition provides a BARC layer having a first reflectivity property.

The method 1100 then proceeds to step 1110 where a second ratio of BARC components is determined. The BARC components may be mixed and/or reacted to provide a BARC material having a second reflectivity. The second ratio of components may be different than the first ratio, provided above in step 1104. The second ratio of BARC components may provide a different reflectivity than the first ratio. In an embodiment, the components are mixed in a mixing chamber such as, the mixing chamber 208, described above with reference to FIG. 2. In an embodiment of the method 1100, the components may be reacted, for example, in a reaction chamber such as the reaction chamber 210, also described above with reference to FIG. 2 property.

The method 1100 then proceeds to step 1112 where the BARC material having the second ratio of components is vapor deposited onto the substrate. The vapor deposition of the BARC material having the first ratio of components may be stopped prior to step 1112. The BARC may be deposited using the vapor deposition system 202, or portion thereof. In an embodiment, the BARC is vaporized in the system 202 and provided to the substrate through nozzles such as, the nozzles 216. In an embodiment, heating element is used to provide a baking process in-situ with the vapor deposition of the BARC material. In a further embodiment, a vacuum device is used to remove evaporants from a formed BARC layer (e.g., released by the baking process). In an embodiment, the heating element and bake process is omitted. The deposition provides a BARC layer having a second reflectivity property. The BARC layer having the first reflectivity property (formed above in step 1108) and the BARC layer having the second reflectivity property may be distinct layer, or may be a single BARC layer including a gradient chemical component distribution (e.g., a varied ratio of components).

In embodiments of the method 1100, the ratio of components of a BARC composition may be continuously modified throughout the vapor deposition process. In embodiments, one or more components may be provided for a portion of the formation of the BARC layer and omitted from a portion of the deposition.

Thus, the method 1100 may provide a vapor deposited BARC layer with a gradient reflectivity and/or absorptance—n,k distribution. This may provide an infinite quantity of reflective planes. This may allow for producing a reflectively close to zero and/or that is relatively free of substrate and topography differences. This is in contrast with a conventional spin-coating process where the formulation and/or n,k values of a BARC material are fixed. Therefore there are only two reflective planes (air/BARC and BARC/substrate) in the conventional spin coated layer. The reflectivity of the BARC layer provided by conventional spin coating processes thus provides a reflectivity based on the thickness of the BARC layer.

Though the method 1100 is described as providing a BARC layer with a gradient n, k value, the method 1100 may be useful for providing any layer of material wherein a gradient chemical component distribution (e.g., a varying of component ratio) is desired. For example, the photoresist of FIGS. 5A, 5B, 6A, 6B, 7A, and 7B may be provided using the method 1100 of portion thereof. The variation of ratio of components includes embodiments where a component is not provided for a portion of the formation of the layer (e.g., a first chemical component and a second component have a ration of 0:1).

Thus, provided are methods and systems for vapor depositing material onto a semiconductor substrate to form one or more layers. The methods and systems provide for varying which components and/or ratio of components that are being supplied to provide for a layer including gradient chemical component distribution. This may be useful in controlling a photoresist profile, reflectivity of an ARC layer, and/or other features. The methods and systems also provide for a bake process and/or heating element to be provided in-situ with the vapor deposition. The elevated temperatures may remove solvent from material being deposited (or deposited) on the substrate.

What is claimed is:

1. A method of fabrication of a semiconductor device, comprising:
   providing a substrate;
   vapor depositing a photoresist material onto the substrate; and
   heating the substrate in-situ and concurrently with the vapor deposition of the photoresist.

2. The method of claim 1, further comprising:
   providing a vacuum during the vapor deposition of the photoresist;
   wherein the photoresist includes a solvent that is removed by the vacuum.

3. The method of claim 1, wherein the photoresist includes a chemical component selected from the group consisting of PAG (photo acid generator), quencher, surfactant, polymer resin, surface segregated additive, crosslinker, chromophore, solvent, and combinations thereof.

4. The method of claim 1, wherein the photoresist includes a first chemical component and a second chemical component, wherein a ratio of the first and second chemical components of the photoresist is changed during the vapor deposition of the photoresist.

5. The method of claim 1, wherein vapor depositing the photoresist forms a layer of photoresist including at least one chemical component gradient from the top surface of the photoresist layer to the bottom surface of the photoresist layer.

6. The method of claim 1, further comprising:
   providing a first chemical component;
   providing a second chemical component;
   mixing the first chemical component and the second chemical component at a first ratio to form the photoresist.

7. The method of claim 1, further comprising:
   forming a layer of photoresist using the vapor deposited photoresist, wherein the layer of photoresist includes a chemical gradient of acid producing components; and
   patterning the layer of photoresist to provide a tapered profile feature.

8. The method of claim 1, wherein the vapor depositing the photoresist includes providing a vapor to the substrate using a plurality of nozzles.

9. The method of claim 1, further comprising:
   vapor depositing a pattern freezing material.

10. A method of fabricating a semiconductor device, comprising:
    providing a substrate;
    providing a first coating material including a first chemical component and a second chemical component at a first ratio;
    vapor depositing the first coating material onto the substrate;

modifying an amount of the first chemical component provided to form a second coating material having a second ratio of the first chemical component and the second chemical component; and vapor depositing the second coating material onto the substrate.

11. The method of claim 10, further comprising:

performing an in-situ baking process during the vapor depositing the first coating material.

12. The method of claim 10, wherein the first coating material and the second coating material are selected from the group consisting of photoresist, BARC, top coat, adhesion layers, crosslinking materials, organic or inorganic etching stop layers, Si, $Si_3N_4$, SiON, Ti, TiN, Ta, TaN, or silicon oxide, and combinations thereof.

13. The method of claim 10, wherein the first coating material and the second coating material each include a photoresist, wherein the first chemical component includes at least one of a polymer, an acid labile molecule, a PAG component, a Quencher component, a chromophore, a crosslinker, and a solvent.

14. The method of claim 10, wherein the first coating material and the second coating material include an antireflective coating material.

15. The method of claim 10, wherein the first coating material and the second coating material provide different reflectivities.

16. The method of claim 10, wherein the vapor depositing the first coating material and the second coating material provides a bottom anti-reflective layer (BARC) having an n,k gradient.

17. A method, comprising:

providing a semiconductor substrate;

providing a first chemical component;

providing a second chemical component;

mixing the first chemical component and the second chemical component at a first ratio to form a photoresist material;

vapor depositing the photoresist material onto the semiconductor substrate; and heating the semiconductor substrate in-situ with the vapor deposition of the photoresist material.

18. The method of claim 17, wherein a ratio of the first and second chemical components of the photoresist is changed during the vapor depositing of the photoresist material.

19. The method of claim 17, wherein vapor depositing the photoresist material forms a layer of photoresist on the semiconductor substrate including at least one chemical component gradient from the top surface of the photoresist layer to the bottom surface of the photoresist layer.

* * * * *

UNITED STATES PATENT AND TRADEMARK OFFICE
CERTIFICATE OF CORRECTION

PATENT NO. : 8,105,954 B2
APPLICATION NO. : 12/254658
DATED : January 31, 2012
INVENTOR(S) : Chien-Wei Wang, David Ding-Chung Lu and Ching-Yu Chang It is certified that error appears in the above-identified patent and that said Letters Patent is hereby corrected as shown below:

Title page, item (73) Assignee: change "aiwan" to "Taiwan"

Signed and Sealed this
Twentieth Day of March, 2012

David J. Kappos
*Director of the United States Patent and Trademark Office*